(12) United States Patent
Yamaguchi

(10) Patent No.: US 9,966,472 B2
(45) Date of Patent: May 8, 2018

(54) ELECTRONIC DEVICE, STACKED STRUCTURE, AND MANUFACTURING METHOD OF THE SAME

(71) Applicant: FUJITSU LIMITED, Kawasaki-shi, Kanagawa (JP)

(72) Inventor: Junichi Yamaguchi, Tsukuba (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/494,680

(22) Filed: Apr. 24, 2017

(65) Prior Publication Data

US 2017/0229583 A1 Aug. 10, 2017

Related U.S. Application Data

(60) Division of application No. 14/536,783, filed on Nov. 10, 2014, which is a continuation of application No. PCT/JP2013/062657, filed on Apr. 30, 2013.

(30) Foreign Application Priority Data

May 10, 2012 (JP) ................. 2012-108730

(51) Int. Cl.
*H01L 21/02* (2006.01)
*H01L 29/786* (2006.01)
(Continued)

(52) U.S. Cl.
CPC .. *H01L 29/78606* (2013.01); *H01L 21/02527* (2013.01); *H01L 21/02636* (2013.01);
(Continued)

(58) Field of Classification Search
CPC ............ H01L 29/1606; H01L 21/0262; H01L 21/02488; H01L 21/02664; H01L 29/7864;
(Continued)

(56) References Cited

U.S. PATENT DOCUMENTS

2011/0048625 A1* 3/2011 Caldwell ............... B82Y 30/00
156/233
2011/0108521 A1 5/2011 Woo et al.
(Continued)

FOREIGN PATENT DOCUMENTS

JP 2009-155168 A 7/2009
JP 2009-164432 7/2009
(Continued)

OTHER PUBLICATIONS

PCT/JP2013/062657: International Search Report dated Jul. 23, 2013.
(Continued)

*Primary Examiner* — Shahed Ahmed
(74) *Attorney, Agent, or Firm* — Kratz, Quintos & Hanson, LLP

(57) ABSTRACT

A stacked structure includes: an insulating substrate; a graphene film that is formed on the insulating substrate; and a protective film that is formed on the graphene film and is made of a transition metal oxide, which is, for example, $Cr_2O_3$. Thereby, at the time of transfer of the graphene, polymeric materials such as a resist are prevented from directly coming into contact with the graphene and nonessential carrier doping on the graphene caused by a polymeric residue of the resist is suppressed.

2 Claims, 4 Drawing Sheets

(51) Int. Cl.
*H01L 29/16* (2006.01)
*H01L 21/78* (2006.01)

(52) U.S. Cl.
CPC ...... *H01L 21/7806* (2013.01); *H01L 29/1606* (2013.01); *H01L 29/78696* (2013.01)

(58) Field of Classification Search
CPC ......... H01L 29/66742; H01L 29/66015; H01L 21/02381; H01L 21/02439; H01L 2924/13088; H01L 29/42368
USPC ........ 257/288, 368, 369; 438/151, 197, 199; 977/734, 742
See application file for complete search history.

(56) References Cited

U.S. PATENT DOCUMENTS

| | | |
|---|---|---|
| 2011/0215300 A1 | 9/2011 | Guo et al. |
| 2012/0049160 A1 | 3/2012 | Sano et al. |
| 2012/0199807 A1* | 8/2012 | Goswami ............ H01L 27/2409 257/9 |
| 2012/0199815 A1 | 8/2012 | Kondo et al. |
| 2012/0292602 A1 | 11/2012 | Guo et al. |
| 2013/0130476 A1* | 5/2013 | Toriumi .............. H01L 29/7781 438/478 |
| 2013/0234762 A1 | 9/2013 | Han et al. |

FOREIGN PATENT DOCUMENTS

| | | |
|---|---|---|
| JP | 2011-105590 A | 6/2011 |
| JP | 2011-114299 A | 6/2011 |
| JP | 2011-175996 A | 9/2011 |
| WO | 2010/113518 A1 | 10/2010 |
| WO | 2011/058651 A1 | 5/2011 |
| WO | 2011/112300 A1 | 9/2011 |

OTHER PUBLICATIONS

PCT/JP2013/062657: International Preliminary Report on Patentability dated Nov. 20, 2014.
U.S. Appl. No. 14/536,783, Office Action dated Sep. 2, 2015.
U.S. Appl. No. 14/536,783, Office Action dated Jan. 27, 2016.
U.S. Appl. No. 14/536,783, Office Action dated Jul. 22, 2016.
U.S. Appl. No. 14/536,783, Office Action dated Dec. 23, 2016.
Japanese Patent Application No. 2012-108730: Office Action dated Nov. 10, 2015.
Taiwanese Patent Application No. 102116375: Office Action dated Dec. 27, 2014.

* cited by examiner

ELECTRONIC DEVICE, STACKED STRUCTURE, AND MANUFACTURING METHOD OF THE SAME

CROSS-REFERENCE TO RELATED APPLICATIONS

This application is a divisional of U.S. patent application Ser. No. 14/536,783, filed Nov. 10, 2014, which is a continuation application of International Application PCT/JP2013/062657, filed on Apr. 30, 2013, which claims the benefit of priority of the prior Japanese Patent Application No. 2012-108730, filed on May 10, 2012, the entire contents of which are incorporated herein by reference.

FIELD

The embodiments discussed herein are directed to an electronic device and a stacked structure that use graphene, and a manufacturing method of the same.

BACKGROUND

When a graphene sheet formed by a chemical vapor deposition method (CVD method) or a thermal decomposition treatment method of a SiC substrate is used for an electronic device such as a transistor, a process of transferring graphene onto an insulating substrate from a growth substrate is needed. For example, in Patent Document 1, the following transfer process has been disclosed. On a graphene formed on a catalyst layer by a CVD method, a protective film of polymethyl methacrylate (PMMA), a photoresist, an electron-beam resist, and the like is formed, and then a support layer made of an acrylic resin, an epoxy resin, a thermal release tape, an adhesive tape, and the like is formed. Next, there is taken a method in which among the support layer, the protective film, the graphene film, and the catalyst layer, the catalyst layer is wet etched, and thereby the support layer, the protective film, and the graphene film are peeled off a growth substrate to be transferred onto another insulating substrate, and then the support layer and the protective film are removed. On the other hand, in Patent Documents 2 and 3, there is disclosed a manufacturing technique of a field-effect transistor using graphene for a channel layer of the transistor and using a high dielectric constant material (high-k material) for a gate insulating layer.

Patent Document 1: Japanese Laid-open Patent Publication No. 2011-105590
Patent Document 2: Japanese Laid-open Patent Publication No. 2011-175996
Patent Document 3: Japanese Laid-open Patent Publication No. 2011-114299

In a transfer process of graphene that has been widely used generally, as a protective film for graphene to be used at the time of transfer, various resists constituted by polymeric materials are used. However, there is a concern that the polymeric materials remain on the graphene as a residue even after a removal process, and when a polymeric residue is adsorbed to an edge portion and a local defect portion of the graphene in particular, removal of the residue is conceived to be very difficult. The polymeric residue causes nonessential carrier doping on the graphene. Therefore, in the graphene transistor using graphene for a channel, for example, deterioration of electrical conduction property and unstable operation are caused.

Further, for efficiently controlling carrier concentration of the graphene transistor, a larger gate capacitance is needed, so that a high dielectric constant material (high-k material) such as $HfO_2$ is used as a gate insulating layer. However, it is difficult to directly form a thin film of the high-k material on graphene, and the gate insulating layer of the high-k material needs to be formed thickly in some degree. As the film thickness of the gate insulating layer increases, the gate capacitance decreases, so that thinning of the gate insulating layer of the high-k material is desired. Further, also from a viewpoint of low-voltage operation of the transistor, thinning of the gate insulating layer of the high-k material is requested.

SUMMARY

An electronic device of the embodiment includes: a substrate; a graphene film that is formed on the substrate; a protective film that is formed on the graphene film and is made of a transition metal oxide; an insulating layer that is formed on the protective film; and an electrode that is formed on the insulating layer.

A manufacturing method of a stacked structure of the embodiment includes: forming a catalyst on a growth substrate; forming a graphene film on the growth substrate by using the catalyst; forming, on the graphene film, a protective film made of a transition metal oxide; and peeling the graphene film and the protective film off the growth substrate and transferring the graphene film and the protective film onto a substrate.

A stacked structure of the embodiment includes: a substrate; a graphene film that is formed on the substrate; and a protective film that is formed on the graphene film and is made of a transition metal oxide.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENT

Hereinafter, there will be explained preferred various embodiments having the embodiments applied thereto in detail with reference to the drawings.

(First Embodiment)

In this embodiment, there will be explained a stacked structure using graphene together with a manufacturing method of the same. FIG. 1A to FIG. 2C are schematic cross-sectional views illustrating a manufacturing method of a stacked structure according to a first embodiment in order of steps.

Figure 1A:
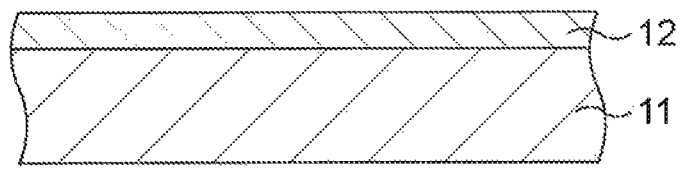
FIG. 1A is a schematic cross-sectional view illustrating a manufacturing method of a stacked structure according to a first embodiment.

First, as illustrated in FIG. 1A, on a growth substrate 11, a catalyst layer 12 is deposited by using a sputtering method.

For the growth substrate 11, a Si substrate having a thermally-oxidized film having a film thickness of 100 nm to 300 nm or so formed thereon is used. For the catalyst layer 12, Cu having a film thickness of 500 nm to 1 μm or so is used. Besides Cu, a metal material containing one type of Fe, Co, Ni, Ru, and Pt can also be used as the catalyst layer.

Figure 1B:
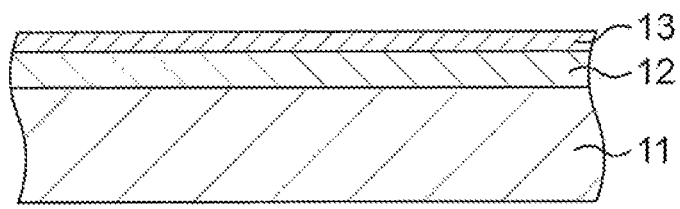
FIG. 1B is, subsequent to FIG. 1A, a schematic cross-sectional view illustrating the manufacturing method of the stacked structure according to the first embodiment.

Subsequently, as illustrated in FIG. 1B, a graphene film 13 is formed by using the catalyst layer 12.

By using a CVD method, the catalyst layer 12 and the growth substrate 11 are heat-treated at about 800° C. in a hydrogen ($H_2$) atmosphere diluted with Ar, and in a state of maintaining the same temperature, $CH_4$ is introduced as a source gas. Thereby, the graphene film 13 is formed. Here, the graphene film 13 is formed into a single layer or two layers. As the source gas, besides $CH_4$, $C_2H_2$, $C_2H_4$, CO each containing C, or the like can be used.

Figure 1C:
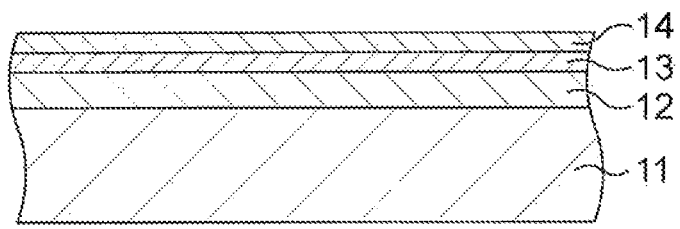
FIG. 1C is, subsequent to FIG. 1B, a schematic cross-sectional view illustrating the manufacturing method of the stacked structure according to the first embodiment.

Subsequently, as illustrated in FIG. 1C, a protective film 14 made of a transition metal oxide is formed on the graphene film 13.

By using an electron-beam deposition method, a transition metal is deposited on the graphene film 13 to have a thickness of 1 nm to 5 nm or so to form a transition metal film. The transition metal film on the graphene film 13 is naturally oxidized by being exposed to the atmosphere, or is oxidized by performing a low-temperature heat treatment (at 200° C. to 300° C. or so) in an oxygen atmosphere, and thereby the protective film 14 is formed.

Besides, as a method of directly forming the protective film 14 of the transition metal oxide on the graphene film 13, an atomic layer deposition method (ALD method), a sputtering method, a pulse laser deposition method (PLD method), or the like can also be used. The transition metal material needs to have both a physical property in which it is oxidized easily and a physical property in which it is not easily chemically bonded with C constituting graphene, namely it does not easily become carbide. For the transition metal (oxide) material, for example, $Sc(Sc_2O_3)$, $Cr(Cr_2O_3)$, $Mn(MnO_2)$, $Co(CoO)$, $Zn(ZnO)$, $Y(Y_2O_3)$, $Zr(ZrO_2)$, $Mo(MoO_3)$, and $Ru(RuO_2)$ can be used.

In this embodiment, $Cr_2O_3$ obtained after Cr is deposited on the graphene film 13 by an electron-beam deposition method and then is naturally oxidized is used for the protective film 14. Ti is well known to be easily oxidized to become $TiO_2$, but when Ti is deposited on graphene, TiCx is formed on an interface between Ti and graphene to destroy crystallinity of the graphene. Therefore, $TiO_2$ is not useful as the material of the protective film.

Figure 2A:
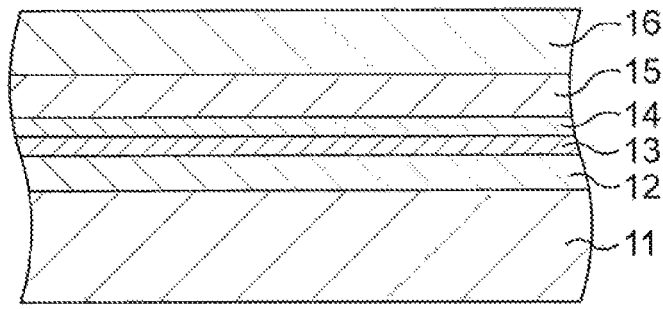
FIG. 2A is, subsequent to FIG. 1C, a schematic cross-sectional view illustrating the manufacturing method of the stacked structure according to the first embodiment.

Subsequently, as illustrated in FIG. 2A, on the protective film 14, an adhesive layer 15 and a support layer 16 are sequentially formed.

On the protective film 14, a photoresist having a thickness of 1 μm to 2 μm or so and an acrylic resin having a thickness of 100 μm to 500 μm or so are sequentially spin-coated. Thereby, the adhesive layer 15 and the support layer 16 are formed on the protective film 14. For the adhesive layer 15, besides the photoresist, PMMA, an electron beam resist, or the like may also be used. Further, for the support layer 16, besides the acrylic resin, an epoxy resin, a thermal release tape, an adhesive tape, or the like can also be used.

Subsequently, the thermally-oxidized film on the growth substrate 11 is wet-etched by using BHF, and the catalyst layer 12, the graphene film 13, the protective film 14, the adhesive layer 15, and the support layer 16 are integrally peeled off the growth substrate 11.

Subsequently, among the catalyst layer 12, the graphene film 13, the protective film 14, the adhesive layer 15, and the support layer 16 peeled off the growth substrate 11, the catalyst layer 12 is wet-etched to be removed. For an etchant, a $FeCl_3$ aqueous solution or dilute HCl is used. For the removal of the catalyst layer 12, besides the wet etching, dry etching such as reactive ion etching or ion milling can also be used. The graphene film 13, the protective film 14, the adhesive layer 15, and the support layer 16 obtained after the removal of the catalyst layer 12 are subjected to rinsing by using a pure water.

Figure 2B:
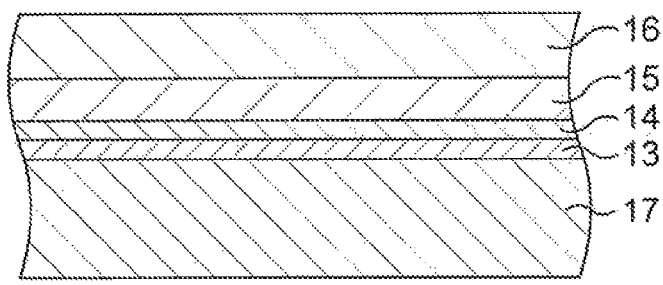
FIG. 2B is, subsequent to FIG. 2A, a schematic cross-sectional view illustrating the manufacturing method of the stacked structure according to the first embodiment.

Subsequently, as illustrated in FIG. 2B, the graphene film 13, the protective film 14, the adhesive layer 15, and the support layer 16 are transferred onto an insulating substrate 17.

The rinsed graphene film 13, protective film 14, adhesive layer 15, and support layer 16 are transferred onto the surface of the insulating substrate 17 in the orientation in which the graphene film 13 comes into contact with the insulating substrate 17 being a transfer destination. Thereafter, a uniform stress is applied from the upper surface of the support layer 16 toward the insulating substrate 17, and thereby adhesiveness between the graphene film 13 and the insulating substrate 17 is increased. For the insulating substrate 17 being a transfer destination, a Si substrate having a thermally-oxidized film having a thickness of 90 nm or so formed thereon is used. This thermally-oxidized film has an insulating function. The insulating substrate 17 needs to have surface flatness but does not have restrictions on material and the like, in particular, and for example, a sapphire substrate, a quartz substrate, a MgO substrate, a PET substrate, or the like can also be used.

Figure 2C:
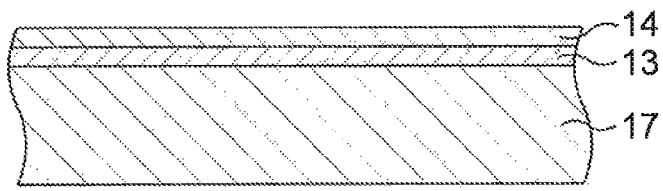
FIG. 2C is, subsequent to FIG. 2B, a schematic cross-sectional view illustrating the manufacturing method of the stacked structure according to the first embodiment.

Subsequently, as illustrated in FIG. 2C, a stacked structure having the graphene film 13 and the protective film 14 on the insulating substrate 17 is formed.

After the transfer onto the insulating substrate 17, the adhesive layer 15 and the support layer 16 among the graphene film 13, the protective film 14, the adhesive layer 15, and the support layer 16 are removed. When an acrylic resin is used for the support layer 16 and a photoresist is used for the adhesive layer 15, they are immersed in an acetone having a temperature of about 70° C. to be removed and rinsing is performed by using an isopropyl alcohol or ethanol. In the above manner, the stacked structure having the graphene film 13 and the protective film 14 on the insulating substrate 17 is formed.

As explained above, according to this embodiment, there is fabricated a highly reliable stacked structure in which at the time of transfer of the graphene film 13, polymeric materials such as the resist are prevented from directly coming into contact with the graphene film 13, nonessential carrier doping on the graphene film 13 caused by a polymeric residue of the resist is suppressed, and the graphene film 13 is provided.

(Second Embodiment)

In this embodiment, as an electronic device using the stacked structure according to the first embodiment, a graphene transistor is described as an example and its constitution is explained together with its manufacturing method. FIG. 3A to FIG. 4B are schematic cross-sectional views sequentially illustrating a main step of a manufacturing method of a graphene transistor according to a second embodiment.

Figure 3A:
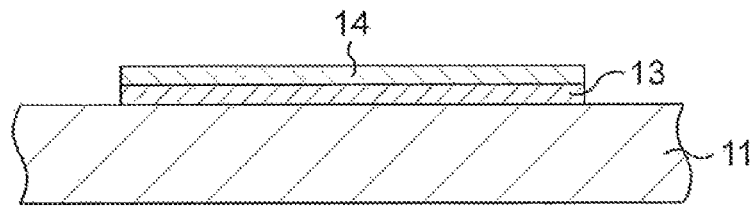
FIG. 3A is a schematic cross-sectional view illustrating a main step of a manufacturing method of a graphene transistor according to a second embodiment.

The stacked structure having the graphene film 13 and the protective film 14 on the insulating substrate 17 according to the first embodiment is prepared. As illustrated in FIG. 3A, the graphene film 13 and the protective film 14 of the stacked structure are worked to a desired channel size of the transistor.

Concretely, by using electron-beam lithography, an electron-beam resist is patterned into a desired channel size, and by using the electron-beam resist as a mask, the graphene film 13 and the protective film 14 are etched. On the protective film 14 of $Cr_2O_3$, wet etching is performed by using ceric ammonium nitrate or a mixed aqueous solution of $HNO_3$ and HCl heated to about 50° C. or so as an etchant. Thereafter, on the graphene film 13, dry etching is performed by $O_2$ plasma. The channel size is set to 100 nm to 1 μm or so in width and 1 μm to 5 μm or so in length.

Figure 3B:
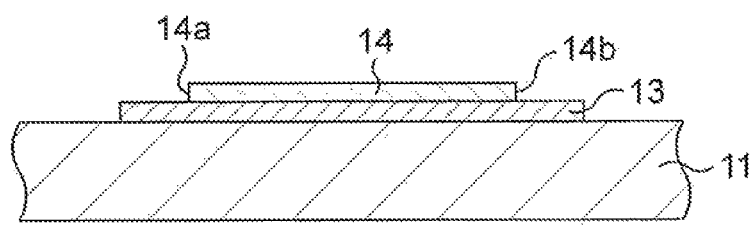
FIG. 3B is, subsequent to FIG. 3A, a schematic cross-sectional view illustrating the main step of the manufacturing method of the graphene transistor according to the second embodiment.

Subsequently, as illustrated in FIG. 3B, the protective film 14 is etched to form electrode formation portions 14a and 14b.

Both end portions of the protective film 14 are etched to form the electrode formation portions 14a and 14b. The graphene film 13 is exposed from the electrode formation portions 14a and 14b, a source electrode and a drain electrode to be described later electrically come into contact with exposed portions of the graphene film 13, and contact resistance decreases.

Figure 3C:
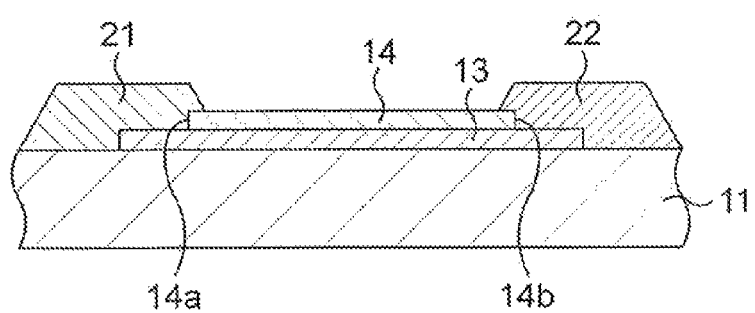
FIG. 3C is, subsequent to FIG. 3B, a schematic cross-sectional view illustrating the main step of the manufacturing method of the graphene transistor according to the second embodiment.

Subsequently, as illustrated in FIG. 3C, a source electrode 21 and a drain electrode 22 are formed.

By electron-beam lithography, a resist mask opening regions containing the electrode formation portions 14a and 14b is formed on the protective film 14, and an electrode metal of Pd, for example, is deposited to have a thickness of 50 nm or so. By liftoff, the resist mask and the Pd thereon are removed. Thereby, the source electrode 21 and the drain electrode 22 electrically connected to the exposed portions, of the graphene film 13, being the electrode formation portions 14a and 14b, are formed. As another electrode material, a single-layer electrode of Cr, Ni, or Pt, or a two-layer electrode of Au and Ti or the like can also be used. Further, a film-forming method of the electrode is not also restricted in particular, and besides the deposition method, a PLD method, a sputtering method, or the like can also be used.

Figure 4A:
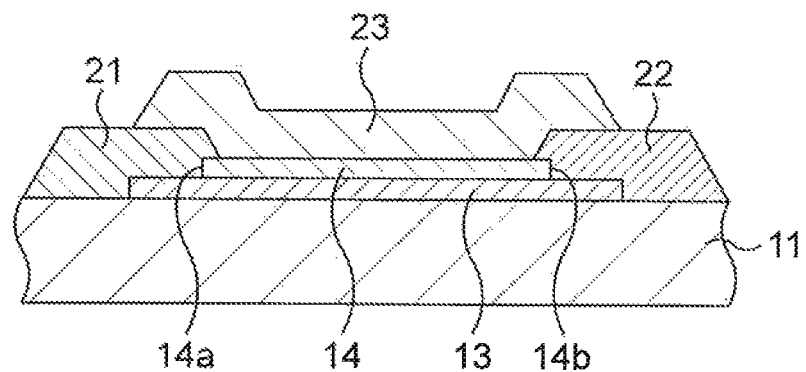
FIG. 4A is, subsequent to FIG. 3C, a schematic cross-sectional view illustrating the main step of the manufacturing method of the graphene transistor according to the second embodiment.

Subsequently, as illustrated in FIG. 4A, a gate insulating layer 23 made of a high dielectric constant material (high-k material) is formed on the protective film 14.

By using an ALD method, on the protective film 14, a high-k material, which is $HfO_2$ here, is deposited to have a thickness of 5 nm to 50 nm or so, which is preferably 5 nm to 10 nm or so and is 5 nm or so here. Thereby, the gate insulating layer 23 is formed on the protective film 14.

It has been said that it is difficult to directly form a thin film of the high-k material on graphene. In this embodiment, on the graphene film 13, the protective film 14 made of the transition metal oxide is formed, and on the protective film 14, the gate insulating layer 23 is formed. Therefore, thinning of the gate insulating layer 23 is enabled. That is, the protective film 14 not only has a function of protecting the graphene film 13 at the time of a transfer process, but also functions as a seed layer used for thinly forming the gate insulating layer 23 made of the high-k material. As the high-k material, besides the above, $Al_2O_3$, $Si_3N_4$, HfSiO, HfAlON, $Y_2O_3$, $SrTiO_3$, $PbZrTiO_3$, $BaTiO_3$, or the like can be used. Further, with regard also to the film-forming method, a CVD method, a deposition method, an ALD method, a PLD method, a sputtering method, or the like can be selected appropriately according to the type of the high-k material.

Figure 4B:
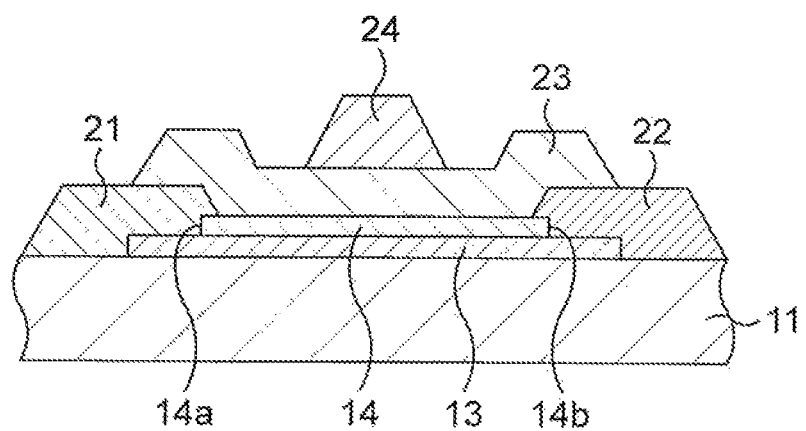
FIG. 4B is, subsequent to FIG. 4A, a schematic cross-sectional view illustrating the main step of the manufacturing method of the graphene transistor according to the second embodiment.

Subsequently, as illustrated in FIG. 4B, a gate electrode 24 is formed on the gate insulating layer 23.

By the forming method similar to that of the source electrode 21 and the drain electrode 22, the gate electrode 24 made of Pd is formed on the gate insulating layer 23 to have a thickness of 50 nm or so. By the above method, the top-gate type graphene transistor is obtained.

According to this embodiment, the stacked structure obtained in the first embodiment is used to constitute the graphene transistor, to thereby obtain a highly reliable graphene transistor whose improvement in electrical property and stable operation are achieved. Further, in the graphene transistor, the protective film 14 that is formed on the graphene film 13 and is made of the transition metal oxide functions as a seed layer of the gate insulating layer 23 of the high-k material, thinning of the gate insulating layer 23 is enabled, and improvement in control efficiency of carrier concentration of the graphene film 13 and low-voltage operation are achieved.

Incidentally, in this embodiment, as the electronic device using the stacked structure according to the first embodiment, the graphene transistor has been described as an example, but the embodiment is not limited to this. The embodiment is applicable to, for example, a display using the stacked structure for a display electrode, and the like.

According to the embodiments, there is fabricated a stacked structure in which at the time of transfer of graphene, polymeric materials such as a resist are prevented from directly coming into contact with the graphene and nonessential carrier doping on the graphene caused by a polymeric residue of the resist is suppressed.

According to the embodiments, an electronic device is constituted by the above-described stacked structure, to thereby obtain a highly reliable electronic device whose improvement in electrical property and stable operation are achieved. Further, in the above-described electronic device, the protective film that is formed on the graphene film and is made of the transition metal oxide functions as a seed layer of the gate insulating layer of the high-k material, thinning of the gate insulating layer of the high-k material is enabled, and improvement in control efficiency of carrier concentration of the graphene film and low-voltage operation are achieved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A manufacturing method of a stacked structure, comprising:
   forming a catalyst on a growth substrate;
   forming a graphene film on the growth substrate by using the catalyst;
   forming, on the graphene film, a protective film made of a transition metal oxide; and
   peeling the graphene film and the protective film off the growth substrate and transferring the graphene film and the protective film onto a substrate.

2. The manufacturing method of the stacked structure according to claim 1, wherein
   a transition metal constituting the transition metal oxide of the protective film is one type selected from Sc, Cr, Mn, Co, Zn, Y, Zr, Mo, and Ru.

* * * * *